United States Patent
Ko

(10) Patent No.: US 11,808,947 B2
(45) Date of Patent: *Nov. 7, 2023

(54) OPTICAL WAVELENGTH DISPERSION DEVICE AND MANUFACTURING METHOD THEREFOR

(71) Applicant: Cheng-Hao Ko, Hsinchu County (TW)

(72) Inventor: Cheng-Hao Ko, Hsinchu County (TW)

(*) Notice: Subject to any disclaimer, the term of this patent is extended or adjusted under 35 U.S.C. 154(b) by 524 days.

This patent is subject to a terminal disclaimer.

(21) Appl. No.: 16/807,137

(22) Filed: Mar. 2, 2020

(65) Prior Publication Data

US 2020/0201056 A1 Jun. 25, 2020

Related U.S. Application Data

(62) Division of application No. 15/885,768, filed on Jan. 31, 2018, now Pat. No. 10,620,445.

(51) Int. Cl.
| | |
|---|---|
| *G02B 27/09* | (2006.01) |
| *G03F 7/00* | (2006.01) |
| *G02B 6/12* | (2006.01) |
| *G02B 6/13* | (2006.01) |
| *G03F 7/20* | (2006.01) |

(52) U.S. Cl.
CPC ..... *G02B 27/0944* (2013.01); *G02B 6/12007* (2013.01); *G02B 6/13* (2013.01); *G03F 7/0005* (2013.01); *G03F 7/2002* (2013.01); *G03F 7/70* (2013.01); *G02B 2006/12104* (2013.01)

(58) Field of Classification Search
CPC .. G02B 27/0944; G02B 6/12007; G02B 6/13; G03F 7/0005; G03F 7/2002; G03F 7/70
See application file for complete search history.

(56) References Cited

U.S. PATENT DOCUMENTS

| | | | |
|---|---|---|---|
| 4,784,935 A * | 11/1988 | Ehrfeld | G02B 6/29328 378/34 |
| 5,734,165 A * | 3/1998 | Unal | G01N 21/031 250/343 |
| 2011/0051402 A1* | 3/2011 | Keller | G02B 6/0068 362/147 |

* cited by examiner

*Primary Examiner* — Peter L Vajda
*Assistant Examiner* — Jayson D Cosgrove
(74) *Attorney, Agent, or Firm* — LAW OFFICE OF MICHAEL CHEN; Che Yang Chen

(57) ABSTRACT

An optical wavelength dispersion device and manufacturing method therefor are disclosed, wherein the optical wavelength dispersion device includes a waveguide unit and a reflector, wherein the waveguide unit has a first substrate, an input unit, a grating and a second substrate. The input unit is formed on the first substrate and having a slit for receiving an optical signal, a grating is formed on the first substrate for producing an output beam once the optical signal is dispersed, the second substrate is located on the input unit and the grating, and forms a waveguide space with the first substrate, the reflector is located outside of the waveguide unit, and is used for change emitting angle of the output beam.

20 Claims, 7 Drawing Sheets

OPTICAL WAVELENGTH DISPERSION DEVICE AND MANUFACTURING METHOD THEREFOR

CROSS REFERENCE OF RELATED APPLICATION

This is divisional application that claims the benefit of priority under 35U.S.C. § 120 to a non-provisional application, application Ser. No. 15/885,768, filed Jan. 31, 2018, which is incorporated herewith by reference in its entity.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention generally relates to a wavelength dispersion device and a manufacturing method for producing the same, more particularly to an optical wavelength dispersion device capable of reducing the size and improving the degree of precise of the optical wavelength dispersion device.

Description of Related Arts

Conventional spectrometers generally use prism, grating or interference to realize dispersion effect, however, the overall size and the resolution ability of a spectrometer needs to be compromised with each other. Therefore, a conventional high resolution spectrometer is more expensive due to the sizable and complicated optical system.

In order to reduce the size of a spectrometer, LIGA (stands for Lithography, Electroplating, and Molding) is applied, which is a micro-manufacturing program combining lithography, electroplating, and molding, so as to enable a micro-structure to have higher degree of precision during manufacturing, moreover, to produce a micro-structure having a height between hundreds and thousands of micrometer. Due to the structure of grating which needs to have small spacing, the yield of LIGA during the molding process and the degree of precision are insufficient for manufacturing vertical gratings.

Hence, how to realize an optical wavelength dispersion device that is capable of reducing the size and improving the degree of precise is certainly a meaningful issue to resolve.

SUMMARY OF THE PRESENT INVENTION

An object of the present invention is to disclose a wavelength dispersion device and a manufacturing method for producing the same, which aim to serve a purpose of reducing the size and improving the degree of precise of the optical wavelength dispersion device.

In order to achieve the objective of the present invention, an optical wavelength dispersion device is provided, which comprises:

a waveguide unit and a reflector, wherein the waveguide unit has a first substrate, an input unit, a grating and a second substrate. The input unit is formed on the first substrate and having a slit for receiving an optical signal, a grating is formed on the first substrate for producing an output beam once the optical signal is dispersed, the second substrate is located on the input unit and the grating, and forms a waveguide space with the first substrate, the reflector is located outside of the waveguide unit, and is used for change emitting angle of the output beam; wherein the input unit and the grating are formed by exposing a photoresist layer under a high energy light source.

According to one embodiment of the present invention, the grating has a concave, convex or planar profile, and with a surface appearing in a continuous laminar type, a sawtooth type, a blaze type, a sinusoidal type, or a combination of the above.

According to one embodiment of the present invention, the first substrate and the second substrate may be selected from any of semiconductor substrates, glass substrates, metal substrates or plastic substrates.

According to one embodiment of the present invention, the high energy light source is selected from any of X-ray, soft X-ray or extreme ultraviolet (EUV).

In order to achieve the objective of the present invention, a manufacturing method for producing an optical wavelength dispersion device is also provided, which includes the following steps: providing a first substrate; forming a photoresist layer on the first substrate; exposing the photoresist layer through a high energy light source mask by using a high energy light source, and the high energy light source has its wavelength ranging from 0.01 nm to 100 nm; developing the photoresist layer so as to form an input unit having a slit and a grating; using a second substrate to cover the input unit and the grating, thereby forming a waveguide unit; and allocating a reflector outside of the waveguide unit.

According to one embodiment of the present invention, the thickness of the photoresist layer is between 10 μm and 1000 μm.

According to one embodiment of the present invention, the high energy light source mask includes a third substrate, a metal layer formed on the third substrate, a plurality of metal patterns formed on the top of the metal layer, and a silicon layer formed on the bottom of the third substrate.

According to one embodiment of the present invention, the third substrate of the high energy light source mask may be made of $Si_3N_4$ or SiC, and the thickness is between 1 μm and 5 μm.

According to one embodiment of the present invention, the metal layer is a Ti layer with a thickness ranging from 10 nm to 200 nm, and the plurality of metal patterns are all Au patterns with a thickness ranging from 1 μm to 10 μm.

According to one embodiment of the present invention, the method further includes a step to coat a high reflectivity coating layer onto the first substrate, the second substrate, the input unit and the grating.

BRIEF DESCRIPTION OF THE DRAWINGS

These and other objects and advantages of the present invention will become apparent from the following description of the accompanying drawings, which disclose several embodiments of the present invention. It is to be understood that the drawings are to be used for purposes of illustration only, and not as a definition of the invention.

FIG. 1 (b) illustrates an explosion drawing of the aforementioned preferred embodiment of the disclosed optical wavelength dispersion device.

FIG. 1 (c) illustrates the aforementioned preferred embodiment of the disclosed optical wavelength dispersion device.

DETAILED DESCRIPTION OF THE PREFERRED EMBODIMENT

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

For those skilled in the art, it is understood that terms disclosed in the present invention, such as "horizontal", "vertical", "up", "down", "front", "rear", "left", "right", "upright", "level", "top", "bottom", "inside", "outside", and etc., are to indicate the directional position or location based on the disclosed figures, which are merely used to describe the present invention and simplify the description without indicating or implying a specific position or location of an apparatus or component, or a specific positional structure or operation. Therefore, the terms are not to be understood as limitations to the present invention.

It is understandable that, "one" is interpreted as "at least one" or "one or more than one", even though one embodiment disclosed in the present invention uses "one" indicating the number of a component is one, it is possible for another embodiment to have "at least one" or "one or more than one" for the number of a component. Therefore, "one" is not to be interpreted as a limitation for number.

Although some words has been used in the specification and subsequent claims to refer to particular components, person having ordinary skill in the art will appreciates that manufacturers may use different terms to refer to a component. The specification and claims are not to be differences in the names as a way to distinguish between the components, but with differences in the function of the component as a criterion to distinguish. As mentioned throughout the specification and claims, in which the "include, has, comprise, and with" are an open-ended term, they should be interpreted as "including but not limited to".

Figure 1A:
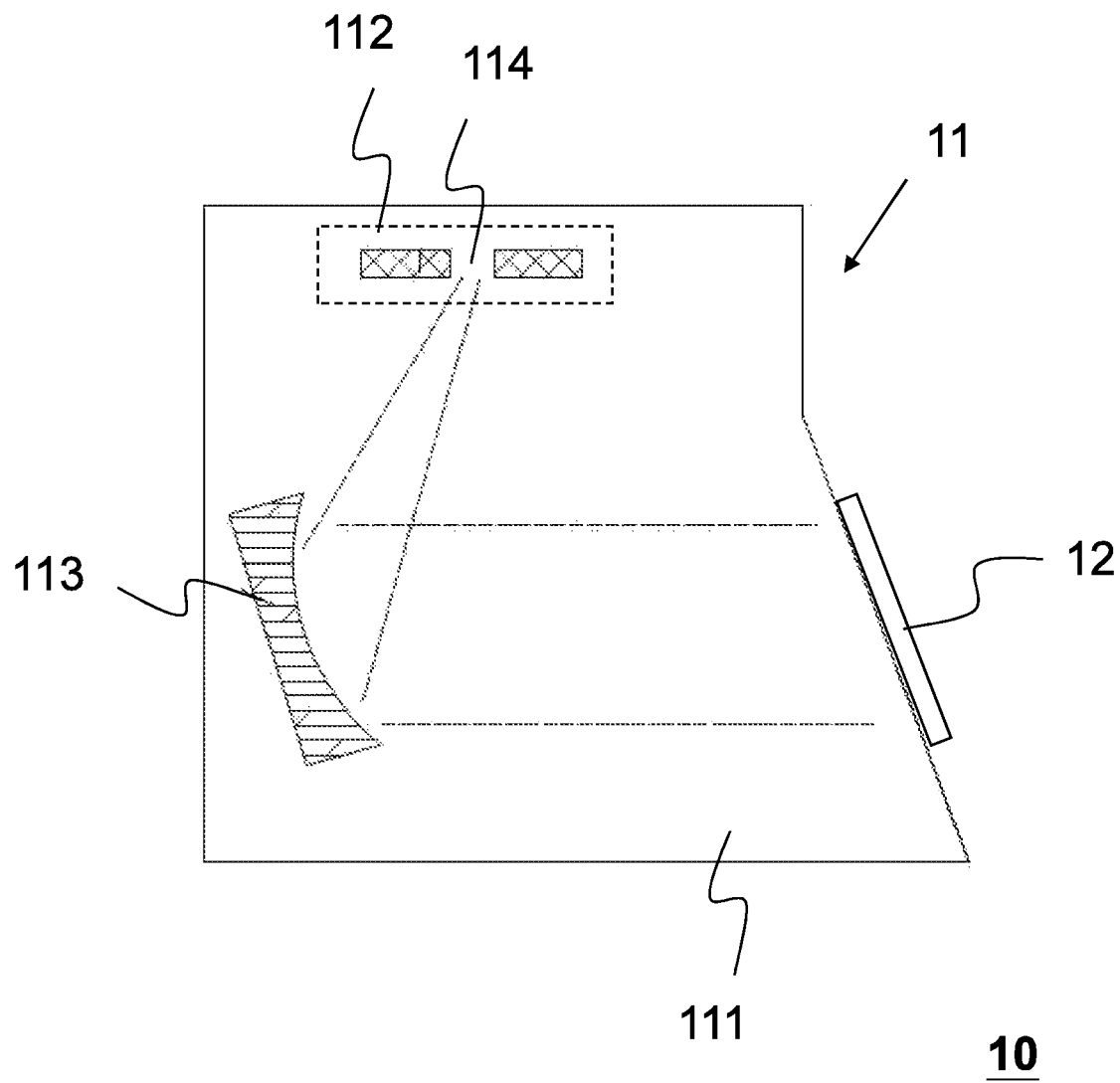
FIG. 1 (a) illustrates a preferred embodiment of the disclosed optical wavelength dispersion device.
Figure 1B:
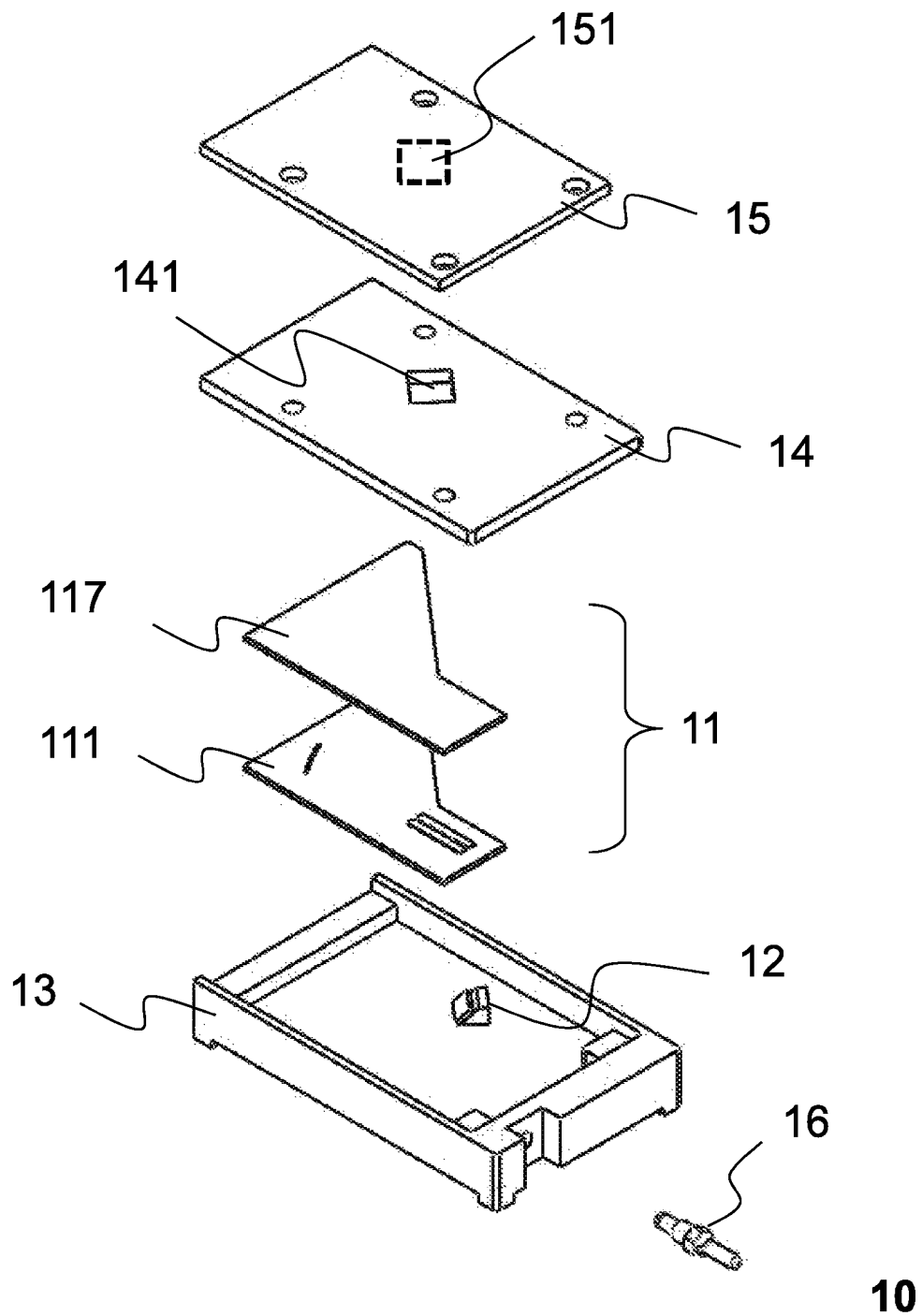
Figure 1C:
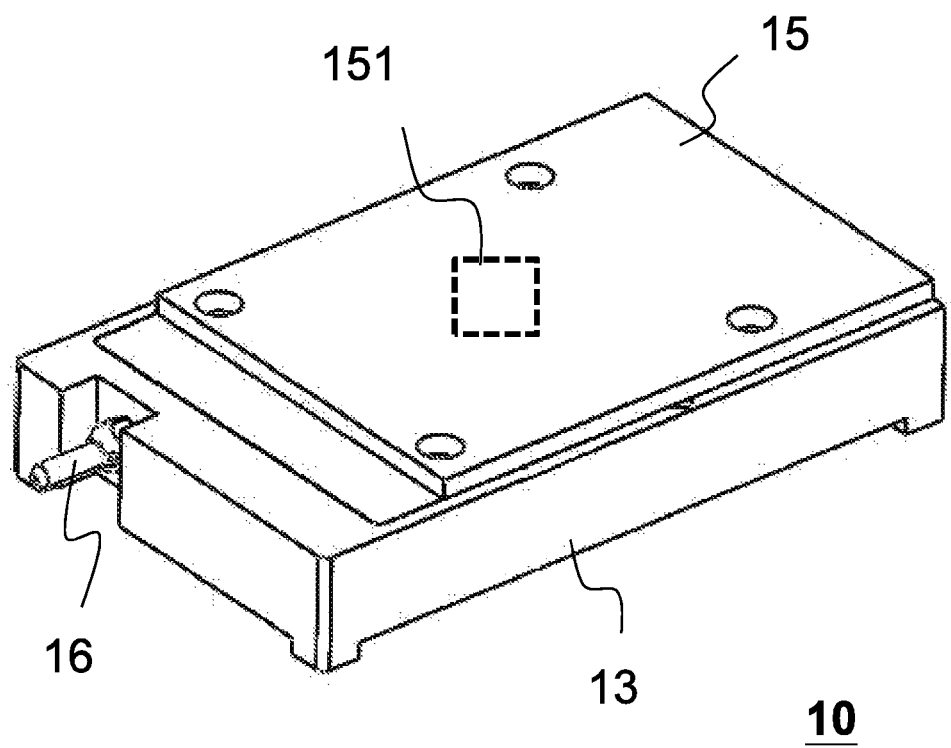
Figure 2:
FIG. 2 illustrates a step in a preferred embodiment of the disclosed manufacturing method for producing the optical wavelength dispersion device.
Figure 3:
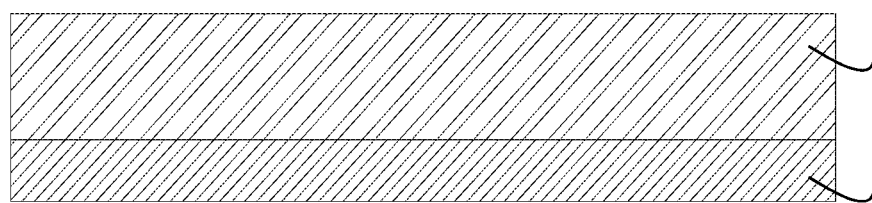
FIG. 3 illustrates a step in a preferred embodiment of the disclosed manufacturing method for producing the optical wavelength dispersion device.
Figure 4:
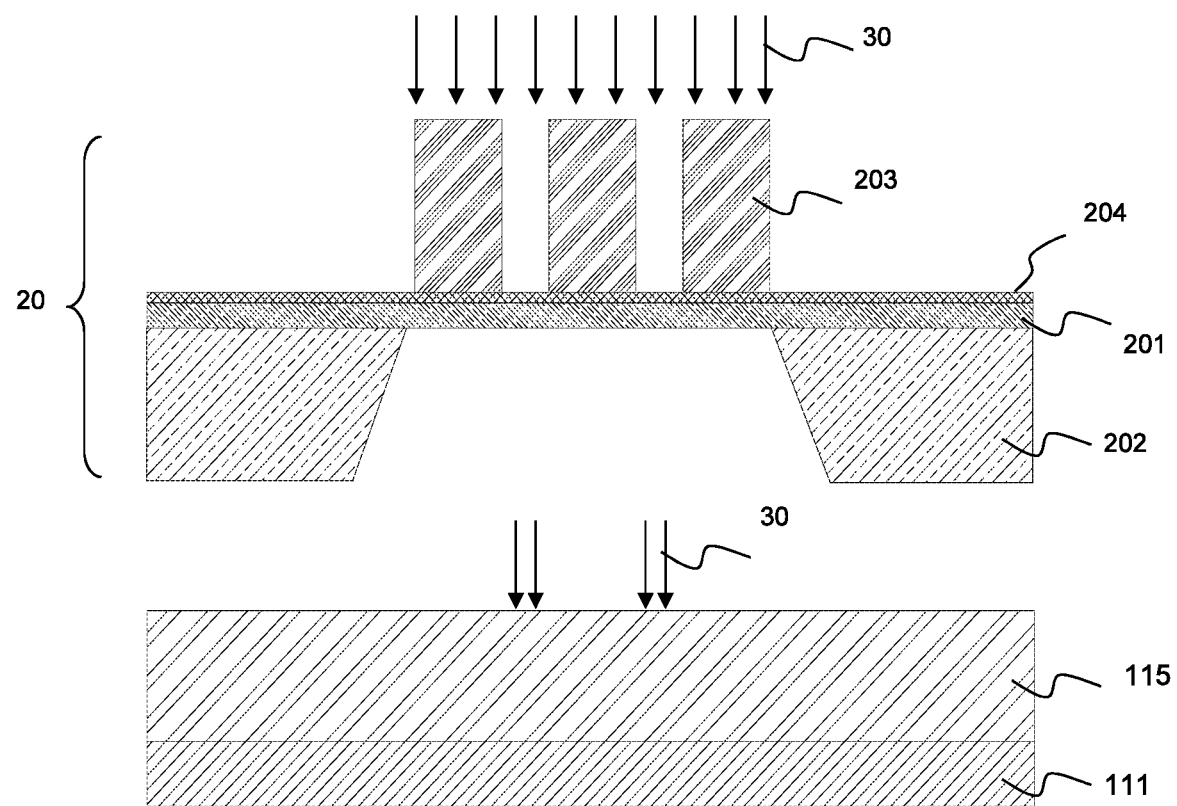
FIG. 4 illustrates a step in a preferred embodiment of the disclosed manufacturing method for producing the optical wavelength dispersion device.
Figure 5:
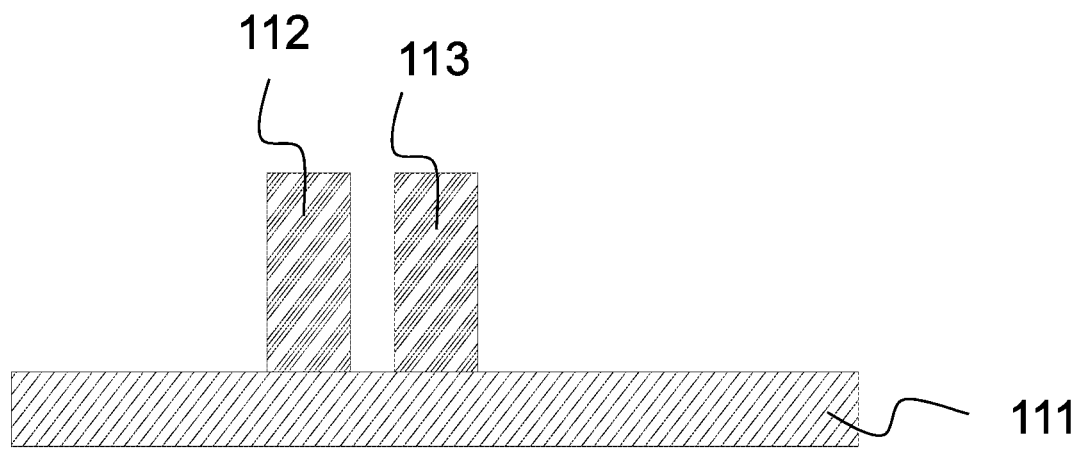
FIG. 5 illustrates a step in a preferred embodiment of the disclosed manufacturing method for producing the optical wavelength dispersion device.
Figure 6:
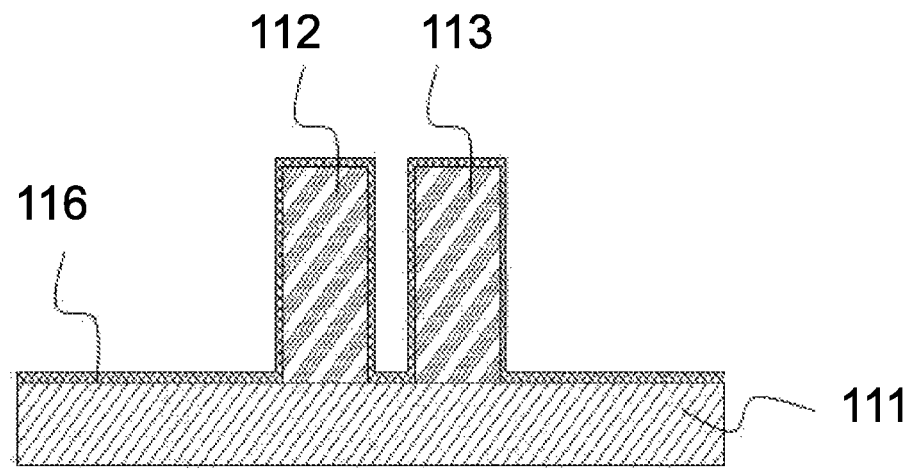
FIG. 6 illustrates a step in a preferred embodiment of the disclosed manufacturing method for producing the optical wavelength dispersion device.

FIG. 1(a)-1(c) illustrate diagrams of the preferred embodiment for the optical wavelength dispersion device disclosed in the present invention, which show: an optical wavelength dispersion device 10 is made of a waveguide unit 11 and a reflector 12. The waveguide unit 11 has a first substrate 111, an input unit 112, a grating 113 and a second substrate (as shown in FIG. 1(b)). The input unit 112 is formed on the first substrate 111 and having a slit 114 for receiving an optical signal, wherein the slit 114 has a width ranged between 5 μm and 500 μm. The grating 113 is formed on the first substrate 111, which generates and outputs a first beam (defocused and focused beam) based on the optical signal, thereby conducting dispersion, and having the incident arranged at the reflector 12 outside of the waveguide unit 11. The grating 113 has a concave, convex or planar profile, and with a surface appearing in a continuous laminar type, a saw-tooth type, a blaze type, a sinusoidal type, or a combination of the above. Generally speaking, the grating 113 is used for increasing the diffraction efficiency of specified diffraction hierarchy, and an appropriate wavelength of the optical signal is from 200 nm to 2000 nm. The reflector 12 is used for outputting the first beam (defocused and focused beam) from the grating 113, and is able to change emitting angle of the first beam.

Image sensor 151 (as shown in FIG. 1(b)) is used for receiving the first beam from the reflector 12 for subsequent processes. The second substrate 117 is covered on the input unit 112 and the grating 113; therefore, space constituted between the first substrate 111 and second substrate 117 can be viewed as a waveguide unit 11, which is used for receiving and transmitting optical signals. In addition, the input unit 112 and the grating 113 are formed by exposing a photoresist layer under a high energy light source. The high energy light source may be selected from any of X-ray, soft X-ray or extreme ultraviolet (EUV), wherein the X-ray has its wavelength ranging from 0.01 nm to 1 nm; the soft X-ray has its wavelength ranging from 0.1 nm to 10 nm; the EUV has its wavelength ranging from 10 nm to 120 nm. The first substrate 111 and the second substrate 117 may be selected from any of semiconductor substrates, glass substrates, metal substrates or plastic substrates. Notably, due to the surface roughness limitation in optical telecommunications and local optical communications, the wavelength with 0.1 nm to 1 nm of the high energy light source is better than that with 1 nm to 100 nm.

Once exposed under the high energy light source, the pitch between adjacent peaks of the grating 113 is about 3 m, and the surface roughness of the grating 113 is from 5 nm to 10 nm. Thus, the grating 113 is suitable for being used in both optical telecommunications and local optical communications.

Furthermore, when the reflector 12 is formed in one-piece by tilting an angle onto the first substrate, the reflecting surface of the reflector 12 will be too rough due to a rotating exposure to meet the need of an optical system, in terms of current semiconductor manufacturing technique. Therefore, one preferred embodiment in the present invention has the reflector 12 allocated outside of the waveguide unit by another semiconductor manufacturing process, thereby increasing the degree of precision for wavelength dispersion.

As disclosed in the aforementioned embodiment, the reflector 12 is used for changing output angle of the first beam from the grating 113, hence, the image sensor 151 can be placed in any direction and location (particularly above or below) of the optical wavelength dispersion device based on user's requirements, thereby reducing the overall size.

The optical wavelength dispersion device 10 further includes a configuration that wraps up the waveguide unit 11 and the reflector 12 by using an outer casing 13 and a covering plate 14. Having protected by the outer casing 13 and the covering plate 14, the waveguide unit 11 and the reflector 12 avoid direct contact with external force, thereby maintaining stability of the overall structure. When optical signal enters into the waveguide unit 11 through the slit 114 of the input unit 16 (usually an optical fiber cable), the process of dispersion begins.

Moreover, since the reflector 12 changes emitting angle of the first beam, the covering plate 14 is arranged with an opening 141 with respect to the reflector 12, thereby enabling the first beam to output. In the preferred embodiment of the present invention, the covering plate 14 is allocated with an IC carrier 15 (IC: integrated circuit), and the image sensor 151 is arranged on the IC carrier 15 in corresponding to the position of the opening 141, so as to receive the first beam for subsequent analyses. To combine the image sensor 151 with the disclosed optical wavelength dispersion device, it reduces further the size of overall system.

FIG. 2 to 7 illustrate the steps of manufacturing method for producing the optical wavelength dispersion device. To manufacture the optical wavelength dispersion device, steps are shown as illustrated in FIG. 2 to 7: firstly, providing a first substrate 111, and forming a photoresist layer 115 with a thickness ranging from 10 nm to 1000 nmm on the first substrate 111, wherein part of elements in the optical wavelength device 10 are to be formed through the photoresist layer 115. The photoresist layer 115 is made of SU-8 (SU-8 is an epoxy-based negative photoresist) or PMMA (PMMA is shorthand for poly (methyl methacrylate)). Secondly, the photoresist layer 115 is exposed through a high energy light source mask 20 under a high energy light source 30 (such as X-ray, soft X-ray or EUV); wherein the high energy light source mask 20 includes a third substrate 201 made of $Si_3N_4$ or SiC, and its thickness is between 1 μm and 5 μm; the high energy light source mask 20 further includes a Ti layer 204 (metal layer) formed on the third substrate 201 with a thickness from 10 nm to 200 nm, a plurality of Au patterns 203 (metal patterns) formed on the Ti layer 204, and a silicon layer 202 formed on the bottom of the third substrate 201. Part of the high energy light source 30 will be shielded by the plurality of Au patterns 203 with thickness from 1 nm to 10 nm, and the Au patterns 203 on the high energy light source 30 will be transferred onto the photoresist layer 115 under an exposure of high energy light source.

For example, having exposed by the high energy light source, the exposed area on the photoresist layer 115 will be developed. Once developed, an input unit 112 with a slit and a grating 113 will be formed on the photoresist layer 115. Additionally, in order to increase input unit 112 and grating 113, hard baking will be performed on the input unit 112 and the grating 113 under temperature from 100° C. to 200° C.

To reinforce the ratio of reflection of the waveguide unit 11 having the first substrate 111, the input unit 112 and the grating 113, a high reflectivity coating layer 116 (Au or Al) can be coated onto the first substrate 111, the input unit 112 and the grating 113.

Figure 7:
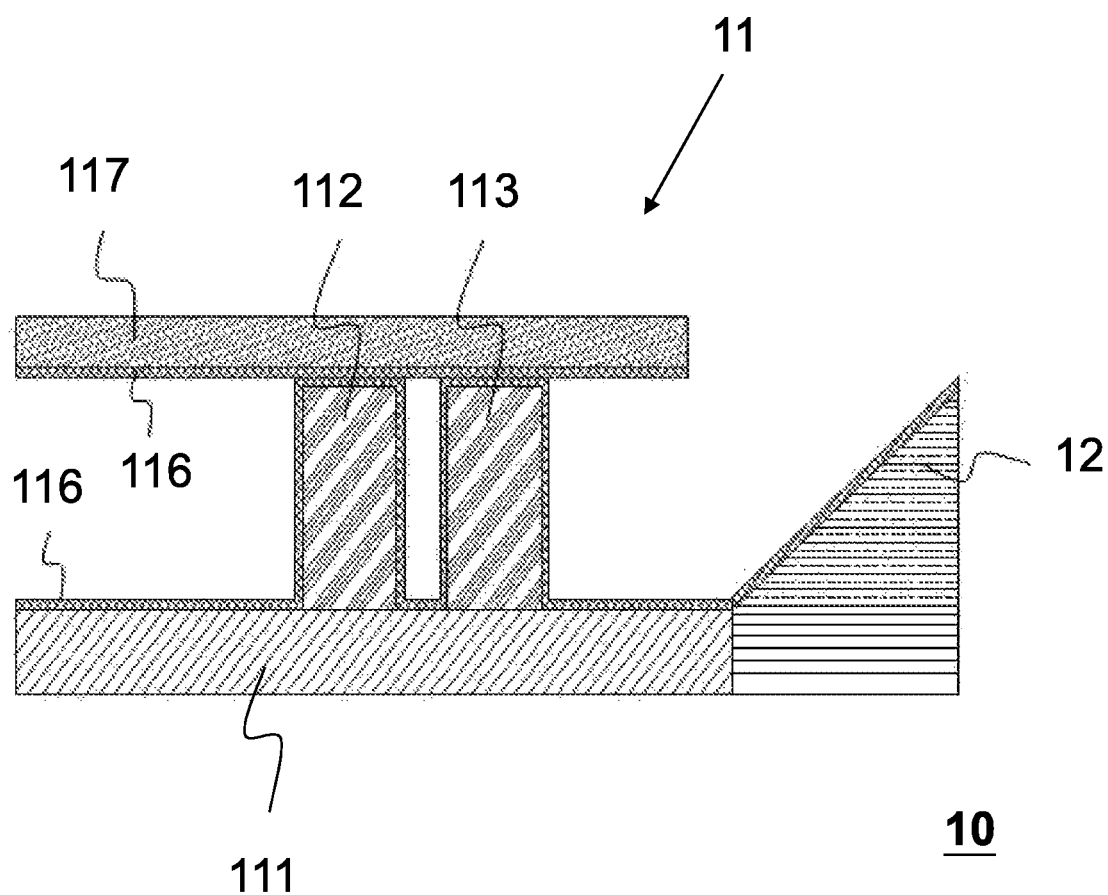
FIG. 7 illustrates a step in a preferred embodiment of the disclosed manufacturing method for producing the optical wavelength dispersion device.

Finally, covering up the input unit 112 and the grating 113 with the second substrate 117 that has been coated with a high reflectivity coating layer 116 (Au or Al). Therefore, a space between the first substrate 111 and the second substrate 117 as shown in FIG. 7 can be viewed as a waveguide space. Then, the reflector 12 is arranged outside of the waveguide unit 11 for changing the output angle of the first beam from the grating 113.

Furthermore, a plurality of first connecting units (not shown) is formed on the first substrate 111, which is used as a connected bridge with the second substrate 117. By the connection of the plurality of connecting units (not shown), the structural stability of the optical wavelength dispersion device can be improved accordingly.

There have thus been shown and described an optical wavelength dispersion device and a manufacturing method for producing the same. Many changes, modifications, variations and other uses and applications of the subject invention will, however, become apparent to those skilled in the art after considering this specification and the accompanying drawings which disclose the preferred embodiments thereof. All such changes, modifications, variations and other uses and applications which do not depart from the spirit and scope of the invention are deemed to be covered by the invention.

Although some words has been used in the specification and subsequent claims to refer to particular components, person having ordinary skill in the art will appreciates that manufacturers may use different terms to refer to a component. The specification and claims are not to be differences in the names as a way to distinguish between the components, but with differences in the function of the component as a criterion to distinguish.

Preferred embodiments are provided only as examples without limiting the scope of the present invention, and modifications will be apparent to those skilled in the art. The purpose of the present invention has been completed and served effectively. The functions and general principles defined in the present invention would be applied to other embodiments, alternatives, modifications, equivalents, and applications without departing from the spirit and scope of the present invention.

What is claimed is:

1. A manufacturing method of optical wavelength dispersion device, comprising steps of:
   (a) providing a first substrate;
   (b) forming a photoresist layer with a thickness ranging from 10 μm to 1000 μm on the first substrate;
   (c) forming an input unit and a grating on the first substrate by exposing the photoresist layer under a high energy light source selected from a group consisting of X-ray having a wavelength ranging from 0.01 nm to 1 nm, soft X-ray having a wavelength ranging from 0.1 nm to 10 nm and ultraviolet (EUV) having a wavelength ranging from 10 nm to 120 nm, wherein the input unit has a slit having a width ranged between 5 μm and 500 μm, wherein the grating is used for receiving an optical signal having a wavelength ranged from 200 nm to 2000 nm and conducting dispersion, wherein the grating has a surface, selected from a group consisting of a continuous laminar type surface, a saw-tooth type surface, a blaze type surface, a sinusoidal type surface, and a combination thereof, for increasing a diffraction efficiency of specified diffraction hierarchy;
   (d) covering the input unit and the grating with a second substrate to constitute a waveguide space between the first substrate and the second substrate for receiving and transmitting the optical signal to form a waveguide unit for generating and outputting a first beam which is a defocused and focused beam based on the optical signal; and (e) allocating a reflector outside the waveguide unit while tilting an angle onto the first substrate for outputting the first beam from the grating, changing an emitting angle of the first beam, changing an output angle of the first beam from the grating, so as to increase a degree of precision for wavelength dispersion to form an optical wavelength dispersion device such that an image sensor, adapted for receiving the first beam from the reflector, is capable of being placed in any direction and location above or below the optical wavelength dispersion device.

2. The manufacturing method, as recited in claim 1, further comprising a step of wrapping the waveguide unit and the reflector with an outer casing and a covering plate in such a manner that the optical signal from an input unit is able to enter into the waveguide space of the waveguide unit through the slit, wherein the covering plate has an opening positioned with respect to the reflector to enable the first beam to output therethrough and in corresponding to the image sensor arranged on an IC carrier.

3. The manufacturing method, as recited in claim 1, wherein the photoresist layer is exposed through a high energy light source mask under the high energy light source, wherein the high energy light source mask includes a third substrate, made of a material selected from a group consisting of $Si_3N_4$ and SiC, having a thickness ranged between 1 μm and 5 μm, a Ti layer formed on the third substrate and having a thickness ranged from 10 nm to 200 nm, a plurality of Au patterns formed on the Ti layer and having a thickness ranged from 1 nm to 10 nm, and a silicon layer formed on a bottom of the third substrate, wherein the photoresist layer is exposed by shielding a part of the high energy light source by the plurality of Au pattern and transferring the high energy light source onto the photoresist layer under an exposure of the high energy light source, wherein once exposed under the high energy light source, a pitch between adjacent peaks of the grating is preferred to be 3 μm and a surface roughness of the grating is ranged from 5 nm to 10 nm.

4. The manufacturing method, as recited in claim 2, wherein the photoresist layer is exposed through a high energy light source mask under the high energy light source, wherein the high energy light source mask includes a third substrate, made of a material selected from a group consisting of $Si_3N_4$ and SiC, having a thickness ranged between 1 μm and 5 μm, a Ti layer formed on the third substrate and having a thickness ranged from 10 nm to 200 nm, a plurality of Au patterns formed on the Ti layer and having a thickness ranged from 1 nm to 10 nm, and a silicon layer formed on a bottom of the third substrate, wherein the photoresist layer is exposed by shielding a part of the high energy light source by the plurality of Au pattern and transferring the high energy light source onto the photoresist layer under an exposure of the high energy light source, wherein once exposed under the high energy light source, a pitch between adjacent peaks of the grating is preferred to be 3 μm and a surface roughness of the grating is ranged from 5 nm to 10 nm.

5. The manufacturing method, as recited in claim 1, after the step (c), further comprising a step of coating the first substrate, the input unit and the grating with a high reflectivity coating layer made of a material selected from a group consisting of Au and Al.

6. The manufacturing method, as recited in claim 2, after the step (c), further comprising a step of coating the first substrate, the input unit and the grating with a high reflectivity coating layer made of a material selected from a group consisting of Au and Al.

7. The manufacturing method, as recited in claim 3, after the step (c), further comprising a step of coating the first substrate, the input unit and the grating with a high reflectivity coating layer made of a material selected from a group consisting of Au and Al.

8. The manufacturing method, as recited in claim 4, after the step (c), further comprising a step of coating the first substrate, the input unit and the grating with a high reflectivity coating layer made of a material selected from a group consisting of Au and Al.

9. The manufacturing method, as recited in claim 3, wherein the photoresist layer is made of a material selected from a group consisting of SU-8 and PMMA.

10. The manufacturing method, as recited in claim 4, wherein said photoresist layer is made of a material selected from a group consisting of SU-8 the PMMA.

11. The manufacturing method, as recited in claim 7, wherein the photoresist layer is made of a material selected from a group consisting of SU-8 and PMMA.

12. The manufacturing method, as recited in claim 8, wherein the photoresist layer is made of a material selected from a group consisting of SU-8 and PMMA.

13. The manufacturing method, as recited in claim 1, wherein each of the first substrate and second substrate is selected from a group consisting of semiconductor substrate, glass substrate, metal substrate, and plastic substrate.

14. The manufacturing method, as recited in claim 2, wherein each of the first substrate and second substrate is selected from a group consisting of semiconductor substrate, glass substrate, metal substrate, and plastic substrate.

15. The manufacturing method, as recited in claim 3, wherein each of the first substrate and second substrate is selected from a group consisting of semiconductor substrate, glass substrate, metal substrate, and plastic substrate.

16. The manufacturing method, as recited in claim 4, wherein each of the first substrate and second substrate is selected from a group consisting of semiconductor substrate, glass substrate, metal substrate, and plastic substrate.

17. The manufacturing method, as recited in claim 7, wherein each of the first substrate and second substrate is selected from a group consisting of semiconductor substrate, glass substrate, metal substrate, and plastic substrate.

18. The manufacturing method, as recited in claim 8, wherein each of the first substrate and second substrate is selected from a group consisting of semiconductor substrate, glass substrate, metal substrate, and plastic substrate.

19. The manufacturing method, as recited in claim 11, wherein each of the first substrate and second substrate is selected from a group consisting of semiconductor substrate, glass substrate, metal substrate, and plastic substrate.

20. The manufacturing method, as recited in claim 12, wherein each of the first substrate and second substrate is selected from a group consisting of semiconductor substrate, glass substrate, metal substrate, and plastic substrate.

\* \* \* \* \*